(12) United States Patent
Cai et al.

(10) Patent No.: US 9,142,768 B2
(45) Date of Patent: Sep. 22, 2015

(54) RESISTIVE MEMORY WITH SMALL ELECTRODE AND METHOD FOR FABRICATING THE SAME

(75) Inventors: Yimao Cai, Beijing (CN); Jun Mao, Beijing (CN); Ru Huang, Beijing (CN); Shenghu Tan, Beijing (CN); Yinglong Huang, Beijing (CN); Yue Pan, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 13/698,799

(22) PCT Filed: May 2, 2012

(86) PCT No.: PCT/CN2012/074968
§ 371 (c)(1),
(2), (4) Date: Nov. 19, 2012

(87) PCT Pub. No.: WO2013/152536
PCT Pub. Date: Oct. 17, 2013

(65) Prior Publication Data
US 2015/0021539 A1    Jan. 22, 2015

(30) Foreign Application Priority Data
Apr. 12, 2012 (CN) .......................... 2012 1 0107418

(51) Int. Cl.
*H01L 45/00* (2006.01)

(52) U.S. Cl.
CPC ............ *H01L 45/1253* (2013.01); *H01L 45/04* (2013.01); *H01L 45/122* (2013.01); CPC *H01L45/1233* (2013.01); *H01L 45/1273* (2013.01); *H01L 45/146* (2013.01); *H01L 45/1608* (2013.01); *H01L 45/1616* (2013.01); *H01L 45/1625* (2013.01)
(Continued)

(58) Field of Classification Search
CPC .... H01L 45/04; H01L 45/122; H01L 45/1233
USPC .............................................. 257/4; 438/104
See application file for complete search history.

(56) References Cited

U.S. PATENT DOCUMENTS

| 2012/0068142 | A1  | 3/2012  | Chang |
| 2012/0074374 | A1  | 3/2012  | Jo |
| 2012/0281452 | A1* | 11/2012 | Huo et al. ..................... 365/148 |

FOREIGN PATENT DOCUMENTS

| CN | 101000944 | 7/2007 |
| CN | 102227014 | 10/2011 |

OTHER PUBLICATIONS

Kim et al., "Reproducible resistance switching characteristics of hafnium oxide-based nonvolatile memory devices," J. Appl. Phys. 104, 114115 (2008).*
International Search Report issued in PCT/CN2012/074968 on Jan. 24, 2013.
H. Dallaporta et al., Silicon dioxide defects included by metal impurities, Physical Review B,The American Physical Society, 1990, vol. 41, No. 8, pp. 5075-5083.
English Language Abstract of CN 101000944 published Jul. 8, 2007.
English Language Abstract of CN 102227014 published Oct. 26, 2011.

* cited by examiner

*Primary Examiner* — Allen Parker
*Assistant Examiner* — Xia L Cross
(74) *Attorney, Agent, or Firm* — DLA Piper LLP (US)

(57) ABSTRACT

Systems and methods are disclosed involving a resistive memory with a small electrode, relating to the field of semiconductor resistive memory in ULSI. An illustrative resistive memory may include an Al electrode layer, a $SiO_2$ layer, a Si layer, a resistive material layer and a lower electrode layer in sequence, wherein the Al electrode layer and the resistive material layer are electrically connected through one or more conductive channel and the conductive channel is formed by penetrating Al material into the Si layer via defects in the $SiO_2$ layer and dissolving Si material into the Al material. Methods may include forming a lower electrode layer, a resistive layer, a Si layer and a $SiO_2$ layer over a substrate; fabricating a Al electrode layer over the $SiO_2$ layer; and performing an anneal process to the resultant structure. Consistent with innovations herein, a small electrode may be obtained via a conventional process.

20 Claims, 4 Drawing Sheets

RESISTIVE MEMORY WITH SMALL ELECTRODE AND METHOD FOR FABRICATING THE SAME

CROSS REFERENCE TO RELATED APPLICATIONS

This application is a U.S. National Stage Application of International Application No. PCT/CN2012/074968 filed May 2, 2012, which claims priority from Chinese Patent Application No. 201210107418.3 filed Apr. 12, 2012. The entirety of all of the above-listed Applications are incorporated herein by reference.

FIELD OF THE INVENTION

The present application relates to the field of semiconductor resistive memory in ULSI (Ultra-Large Scale Integration) and in particular, to a resistive memory which can reduce an electrode area and a method for fabricating the same.

RELATED ART OF THE INVENTION

The semiconductor memory is an indispensable component in various electronic device and is widely used in various portable device such as cell phone, notebook and palm. However, with the rapid development of portable or moveable device in recent years, various memories of different performances occupy the market and these memories cause a further research and design in the memory field.

Currently, some of commercial memories belong to a floating gate flash memory in which a polysilicon gate doped with dopant such as boron and phosphorus is used as a floating gate and a control gate. In recent twenty years, the flash memory develops rapidly. However, with the sharp decrease of the size of the memory unit in flash memory, how to reduce the size of the flash memory with the same ratio becomes a big challenge. Particularly, when the feature size is less than a technical node of 45 nm, the distance between memory units in flash memory reduces and the interference between the memory units aggravates. Thus, the reliably of the flash memory is affected.

In comparison, the resistive memory gets more and more attention due to the properties such as nonvolatile, high reliably, simple structure and compatibility with current CMOS process. The resistive memory is a new memory device in which the resistance of the resistive material is changed by applying different voltages with different polarities to store data. In view of the structure, the resistive memory includes an upper electrode, a resistive material layer and a lower electrode, as shown in FIG. 1. More and more people begin to study the resistive memory. In order to meet a higher requirement to memory, the operation current of the resistive memory, that is, the current from a low resistance state to a high resistance state (i.e. current for the reset operation) is expected to become lower and lower. There are many methods for reducing the operation current and one of methods is implemented by reducing the area of electrodes.

Currently, the resistive memory generally has a MIM structure or a cross structure. In the MIM structure, a resistive material is sandwiched between the upper electrode and the bottom electrode, similar to a capacitor structure. In the cross structure, two small electrodes i.e. the upper electrode and the bottom electrode are crossed perpendicular to each other and the resistive material is filled in the area where the two electrodes are overlapped. Each structure has a MIM structure (metal electrode-resistive material-metal electrode) similar to the capacitor structure. Currently, the resistive memory (referred to as RRAM as below) requires a small operation current. One method for obtaining the small operation current is to reduce the electrode area. The smaller the electrode area is, the smaller the effective area of the electrical field of the resistive material is. Thus, the formed conductive wire becomes more concentrate and the operation current becomes smaller. Moreover, the performance parameter of the RRAM is more concentrated and the fluctuation is reduced. The bottleneck of the prior art lies in how to make the electrode smaller, particularly, to the hundred-nanometer level or ten-nanometer level. Currently, making the electrode smaller requires a huge cost and the processes thereof are unstable.

SUMMARY OF THE INVENTION

In view of the above problem, an object of the invention is to provide a resistive memory with a small electrode structure and the fabrication method thereof in which the contact area between the top electrode and the resistive material is reduced to implement the reduction of the operation current.

FIG. 2 shows a structure of a resistive memory according to an embodiment of the present invention. In the structure, an Al (aluminum) electrode, a $SiO_2$ layer, a Si (Silicon) layer, a hafnium oxide resistive layer and a Pt (platinum) electrode are disposed from the top down. The Al electrode is the top electrode, the Pt electrode is the bottom electrode, the hafnium oxide resistive layer is the resistive material. The Al electrode, the $SiO_2$ layer and the Si layer form an upper electrode and the hafnium oxide is used as the resistive layer. FIG. 3 shows the concept of the structure in which the fact that the solubility of Si in Al is big while the solubility of Al in Si is small and can be neglected is used. In a traditional MOS process, in the case that a gate electrode is made of Al, because the $SiO_2$ layer have defects therein, a portion of Al penetrate to a Si layer via the defects in the $SiO_2$ gate oxide layer. However, since the Si is easy to be dissolved in Al, Si is dissolved into the portion of Al penetrated from the $SiO_2$ layer. The vacancies formed by the dissolved Si are replaced by Al. In this way, the Al is pierced into the Si, like a needle. By forming the Si layer to have a suitable thickness through process parameters such as anneal temperature, the needle of Al is made to only pierce through the Si layer but not absorb all Si material over the surface. Thus, the top electrode of Al is pierce through the $SiO_2$ layer and the Si layer till the resistive material of tantalum oxide. Hence, the small electrode of the resistive memory is achieved, the effective electrode area is reduced, the current consumption is lowered and the performance of the device is optimized.

The technical solution according to an embodiment of the present invention is as follows.

A resistive memory with a small electrode, wherein, including an Al electrode layer, a $SiO_2$ layer, a Si layer, a resistive material layer and a bottom electrode layer in sequence, wherein, the Al electrode layer and the resistive material layer are electrically connected through one or more conductive channel and the conductive channel is formed by penetrating Al material into the Si layer via defects in the $SiO_2$ layer and dissolving Si material into the Al material.

A method for fabricating a resistive memory with a small electrode, including:

1) forming a bottom electrode layer and a resistive layer over a substrate;

2) fabricating a Si layer and a $SiO_2$ layer over the resistive layer;

3) fabricating an Al electrode layer over the $SiO_2$ layer;

4) performing an anneal process to resultant structure to form one or more conductive channel between the Al electrode layer and the resistive layer, wherein, the conductive channel is formed by penetrating Al material into the Si layer via defects in the SiO$_2$ layer and dissolving Si material into the Al material.

Furthermore, in the step 2), a Si layer is formed on the resistive layer firstly and then an oxidation process is performed to the Si layer to form the SiO$_2$ layer.

Furthermore, the thickness of the Si layer depends on V/A, wherein, V represents the diffusion distance of Si material in Al material and A represents the contact area between the Al layer and the Si layer in the conductive channel.

Furthermore, the thickness of the Si layer is larger than 100 nm and the thickness of the SiO$_2$ layer is 100 nm.

Furthermore, the lower electrode layer and the resistive layer are formed by the chemical vapor deposition method; the Si layer is formed by the physical vapor deposition method; the SiO$_2$ layer is formed by forming a Si layer through a chemical vapor deposition method firstly and then oxidizing the surface of the Si layer through a diffusion process; the Al electrode layer is formed through the atom layer deposition method.

Furthermore, the resistive layer is made of hafnium oxide and the lower electrode layer is made of Pt.

Compared with the prior art, the beneficial effect of the present invention is as follows.

In the present invention, a small electrode is obtained with a conventional process. Thus, the cost is lowered and the device is optimized. In the method of the present invention, a smaller electrode area is implemented with a lower cost. In the structure of the present invention, the area of the Al electrode is submicron-level or micron-level, however, the effective electrode area only includes the tip of the needle because the Al material is pierced into the surface of the resistive material like the needle. In other words, a nano-level device is implemented with a micron-level process cost.

BRIEF DESCRIPTION OF THE DRAWINGS

FIG. 3(a) is a diagram of the SiO$_2$ layer penetrated by the top electrode and FIG. 3 (b) is a diagram of the Si layer penetrated by the top electrode;

DETAILED DESCRIPTION OF THE INVENTION

A further detailed description of the present invention is provided with reference to the drawings.

Figure 1:
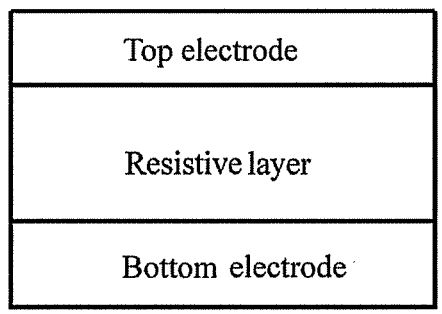
FIG. 1 is a structure diagram of a conventional resistive memory.
Figure 2:
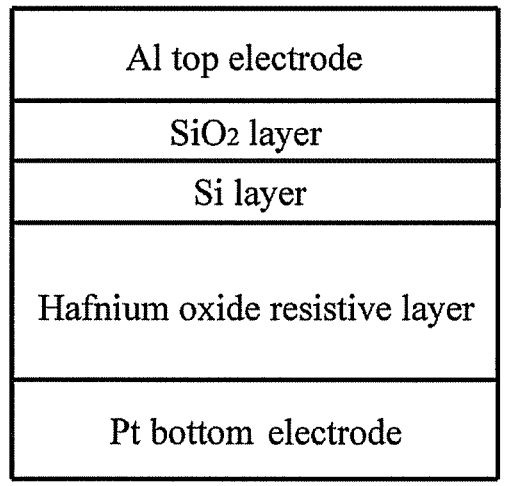
FIG. 2 is a structure diagram of a resistive memory with a small electrode according to an embodiment of the present invention.
Figure 3:
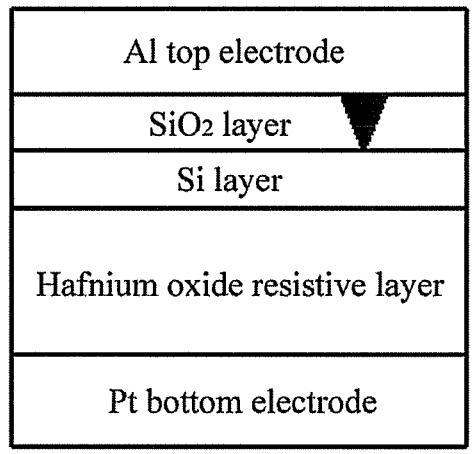
FIG. 3 is a structure diagram showing the inventive concept of the present invention, particularly.
Figure 3:
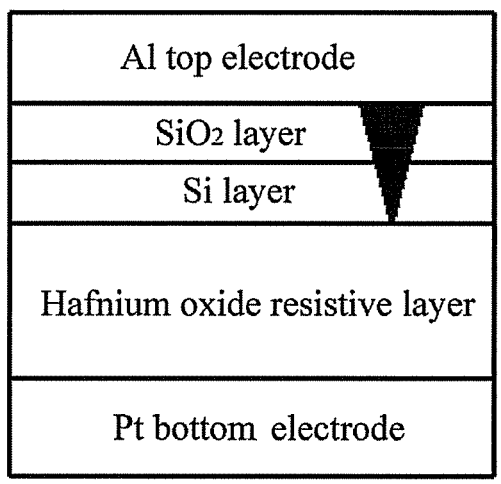
Figure 4:
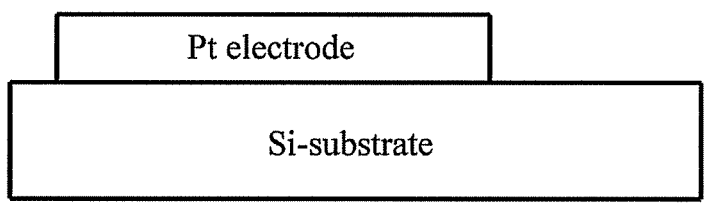
FIG. 4 (a)-(f) are flow charts according to an embodiment of the present invention.
Figure 4:
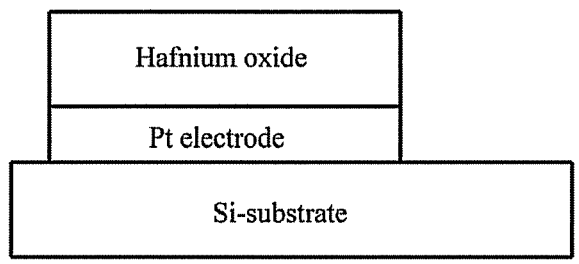
Figure 4:
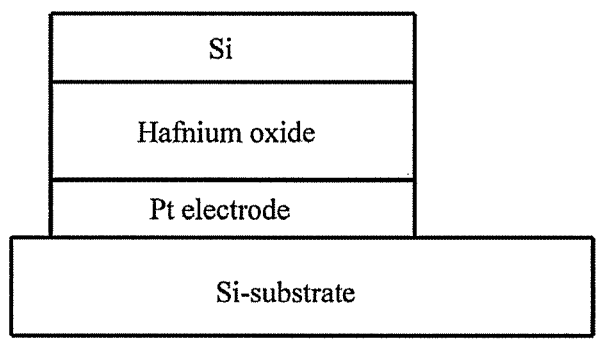
Figure 4:
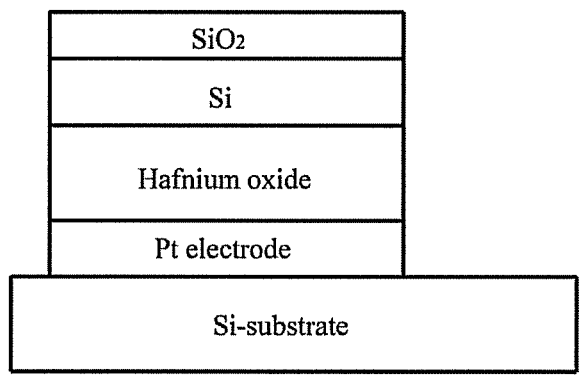
Figure 4:
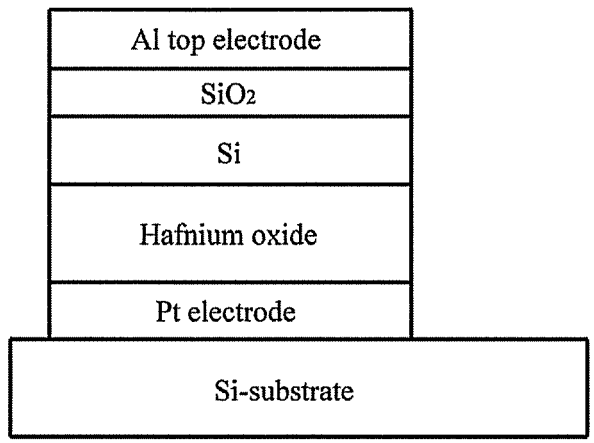
Figure 4:
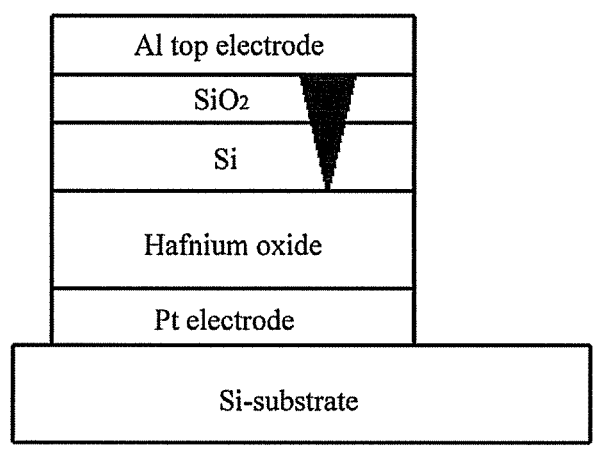

FIG. 4 shows a flow chart of the fabrication method according to an embodiment of the present invention.

At step 1, the bottom electrode is formed as shown in FIG. 4 (a).

A Pt layer with a thickness of 50-200 nm (depending on application) is deposited over a Si wafer by chemical vapor deposition method as the bottom electrode.

At step 2, a resistive layer is formed, as shown in FIG. 4 (b).

A hafnium oxide of 50 nm is deposited over the Pt layer by the CVD method as the resistive layer. The thickness of the resistive layer may be changed according to the requirement for the device performance and may be several nanometers to several hundred nanometers.

At step 3, a Si layer is deposited, as shown in FIG. 4 (c).

A Si layer (about 100 nm) is deposited over the surface of the hafnium oxide by the PVD method. The thickness of the Si layer is not allowed to be too thin. If the thickness of the Si layer is too thin, Si material will be totally absorbed by Al material. Generally, the thickness of the Si layer is at least at hundred-nanometer level i.e. is larger than 100 nm.

At step 4, a Si layer is formed by CVD method so as to form a SiO$_2$ layer (100 nm), as shown in FIG. 4 (d).

The Si surface is oxided by a diffusion process to form a SiO$_2$ layer.

At step 5, the Al electrode (100 nm) is formed by the ALD method, as shown in FIG. 4(e).

At step 6, an anneal process is performed at 500° C. for 10 minutes, as shown in FIG. 4 (f).

The needle structure of the Al is formed with the anneal process.

The key points of the fabrication method are as follows.

1. In the present invention, the fact that the Si material has a certain solubility in the Al material is used. Assuming that an Al line with a width of w and a thickness of d is formed and the contact area between the Al line and the Si underneath is A, the diffusion distance of the Si material in Al material after performing an anneal process for a period t is as follows.

$$V=2\sqrt{Dt}(w*d)*S*n_{Al}/n_{Si}$$

In above formula, t represents the anneal time, D represents the diffusion coefficient, $n_{Al}$ and $n_{Si}$ represent the densities of Al material and Si material respectively, S represents the solubility of Si material in Al material. When Si is rapidly diffused in the gap of the crystal grain of Al film, Al material is also dissolved in the Si material to fill the space due to the loss of Si material. The thickness of consumed Si material is as follows:

$$Z = 2\sqrt{Dt}\left(\frac{w*d}{A}\right)*S*\left(\frac{n_{Al}}{n_{Si}}\right) = V/A.$$

The thickness of the consumed Si may be calculated based on the formula. However, the thickness of the consumed Si may also depend on other factors because the above formula is just an ideal formula. The anneal process is a process in which the anneal temperature is kept at a certain value for a period to induce the reaction.

For example, in the case that the anneal temperature is 500° C., the anneal time is about 30 minutes, the contact area A is 44 μm$^2$, w is 5 μm and d is 1 μm, the Z is 0.3 μm.

In fact, the main factor affecting the shape of the Al needle is the thickness of the oxide layer at the Al—Si interface, i.e. the thickness of the SiO$_2$ layer. The thickness of the SiO$_2$ may range from 100 nm to 1 mm. If the SiO$_2$ layer is too thin (for example, an oxide layer over a cleaned Si wafer formed in atmosphere) such as 1 nm, the SiO$_2$ layer is easy to be replaced by the Al material and the reaction area of Al and Si is very big, so that the needle becomes big and shallow. On the other hand, if the SiO$_2$ layer is too thick (for example, a SiO$_2$ layer over a Si wafer exposed to the atmosphere for several days), the reaction area of Al and Si only includes a few points and is difficult to be diffused, but the volume of the consumed Si is not changed and the Al needle becomes sharp and small.

The invention claimed is:

1. A resistive memory with a small electrode comprising:
an Al top electrode layer having a reduced effective area forming the small electrode,
a SiO$_2$ layer,
a Si layer,
a resistive material layer and
a lower electrode layer in sequence,
wherein
the Al top electrode layer and the resistive material layer are electrically connected through one or more conductive channels and
the conductive channels are formed by penetrating of Al material into the Si layer via defects in the SiO$_2$ layer and dissolving of Si material into the Al material,
wherein the reduced effective area of the Al top electrode layer is formed by the penetrating of the Al material into the Si layer,
wherein the conductive channels are formed as a needle structure that penetrates the SiO$_2$ layer and the Si layer to the resistive material layer,
wherein the material of the resistive layer is made of hafnium oxide, and
wherein the thickness of the Si layer is larger than 100 nm to prevent the Si material from being totally absorbed by the Al material.

2. The resistive memory according to claim 1, wherein, the thickness of the Si layer is determined on V/A, wherein, V is a diffusion distance of Si material in Al material and A represents the contact area between Al and Si in the conductive channels.

3. The resistive memory according to claim 2, wherein, the thickness of the SiO$_2$ layer is about 100 nm.

4. The resistive memory according to claim 3, wherein the lower electrode layer is made of Pt.

5. The resistive memory according to claim 2, wherein the lower electrode layer is made of Pt.

6. The resistive memory according to claim 1, wherein, the thickness of the SiO$_2$ layer is about 100 nm.

7. The resistive memory according to claim 6, wherein the lower electrode layer is made of Pt.

8. The resistive memory according to claim 1, wherein the lower electrode layer is made of Pt.

9. A method for fabricating a resistive memory with a small electrode, the method comprising:
forming a lower electrode layer and a resistive layer over a substrate;
fabricating a Si layer and a SiO$_2$ layer over the resistive layer;
fabricating a Al top electrode layer having a reduced effective area forming the small electrode over the SiO$_2$ layer; and
performing an anneal process to a resultant structure including the Al top electrode layer, the SiO$_2$ layer, the Si layer, the resistive material layer and the lower electrode layer to form one or more conductive channels between the Al top electrode layer and the resistive layer,
wherein the conductive channels are formed by penetrating of Al material into the Si layer via defects in the SiO$_2$ layer and dissolving of Si material into the Al material,
wherein the reduced effective area of the Al top electrode layer is formed by the penetrating of the Al material into the Si layer,
wherein the conductive channels are formed as a needle structure that penetrates the SiO$_2$ layer and the Si layer to the resistive material layer,
wherein the resistive layer is made of hafnium oxide, and
wherein the thickness of the Si layer is larger than 100 nm to prevent Si material from being totally absorbed by the Al material.

10. The method according to claim 9, wherein, in the step of fabricating the Si layer and the SiO$_2$ layer, the Si layer is first formed on the resistive layer and then an oxidation process is performed to the Si layer to form the SiO$_2$ layer.

11. The method according to claim 10, wherein, the thickness of the Si layer depends on V/A, wherein, V represents the diffusion distance of Si material in Al material and A represents the contact area between Al and Si in the conductive channels.

12. The method according to claim 11, wherein, the thickness of the SiO$_2$ layer is about 100 nm.

13. The method according to claim 9, wherein, the lower electrode layer and the resistive layer are formed by a chemical vapor deposition method; the Si layer is formed by a physical vapor deposition method; the SiO$_2$ layer is formed by forming a Si layer through a chemical vapor deposition method firstly and then oxidizing the surface of the Si layer through a diffusion process; the Al top electrode layer is formed through an atom layer deposition method.

14. The method according to claim 13, wherein, the thickness of the Si layer depends on V/A, wherein, V represents the diffusion distance of Si material in Al material and A represents the contact area between Al and Si in the conductive channels.

15. The method according to claim 9, wherein the lower electrode layer is made of Pt.

16. The method according to claim 15, wherein, the thickness of the Si layer depends on V/A, wherein, V represents the diffusion distance of Si material in Al material and A represents the contact area between Al and Si in the conductive channels.

17. The method according to claim 9, wherein, the thickness of the Si layer depends on V/A, wherein, V represents the diffusion distance of Si material in Al material and A represents the contact area between Al and Si in the conductive channels.

18. The method according to claim 17, wherein, the thickness of the SiO$_2$ layer is about 100 nm.

19. The method according to claim 9, wherein the SiO2 layer is formed by forming a Si layer through a chemical vapor deposition method firstly and then oxidizing the surface of the Si layer through a diffusion process.

20. The method according to claim 19, wherein, the thickness of the Si layer depends on V/A, wherein, V represents the diffusion distance of Si material in Al material and A represents the contact area between Al and Si in the conductive channels.

* * * * *